(12) United States Patent
Gilton et al.

(10) Patent No.: US 6,861,367 B2
(45) Date of Patent: Mar. 1, 2005

(54) SEMICONDUCTOR PROCESSING METHOD USING PHOTORESIST AND AN ANTIREFLECTIVE COATING

(75) Inventors: Terry L. Gilton, Boise, ID (US); Steve W. Bowes, Boise, ID (US); John T. Moore, Boise, ID (US); Joseph F. Brooks, Nampa, ID (US); Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/719,640

(22) Filed: Nov. 21, 2003

(65) Prior Publication Data

US 2004/0102046 A1 May 27, 2004

Related U.S. Application Data

(62) Division of application No. 10/071,425, filed on Feb. 8, 2002.

(51) Int. Cl.$^7$ ........................................... H01L 21/4763
(52) U.S. Cl. ...................... 438/737; 438/736; 438/725; 438/745
(58) Field of Search .................. 438/636, 704–717, 438/734–738, 745–757, 948–950, 952, 700, 702, 724–725; 430/311–317

(56) References Cited

U.S. PATENT DOCUMENTS

| | | | |
|---|---|---|---|
| 4,127,414 A | | 11/1978 | Yoshikawa et al. |
| 4,320,191 A | | 3/1982 | Yoshikawa et al. |
| 4,368,099 A | * | 1/1983 | Huggett et al. ............... 216/48 |
| 6,350,559 B1 | * | 2/2002 | Templeton et al. ......... 430/322 |

FOREIGN PATENT DOCUMENTS

JP    60-226123    11/1985

OTHER PUBLICATIONS

Lee, Hyun–Yong et al., "Lithographic Properties of $SiN_x$ and $Se_{75}Ge_{25}$ Thin Films as the Low–Energy Ion–Beam Resist", Proceedings of the $5^{th}$ International Conference on Properties and Applications of Dielectric Materials, May 25–30, 1997, p.635–638.

* cited by examiner

Primary Examiner—Carl Whitehead, Jr.
Assistant Examiner—Thanhha Pham
(74) Attorney, Agent, or Firm—Wells St. John P.S.

(57) ABSTRACT

A semiconductor processing method includes forming an antireflective coating comprising Ge and Se over a substrate to be patterned. Photoresist is formed over the antireflective coating. The photoresist is exposed to actinic radiation effective to pattern the photoresist. The antireflective coating reduces reflection of actinic radiation during the exposing than would otherwise occur under identical conditions in the absence of the antireflective coating. After the exposing, the substrate is patterned through openings in the photoresist and the antireflective coating using the photoresist and the antireflective coating as a mask. In one implementation, after patterning the substrate, the photoresist and the antireflective coating are chemically etched substantially completely from the substrate using a single etching chemistry.

17 Claims, 3 Drawing Sheets

SEMICONDUCTOR PROCESSING METHOD USING PHOTORESIST AND AN ANTIREFLECTIVE COATING

RELATED PATENT DATA

This patent resulted from a divisional application of U.S. patent application Ser. No. 10/071,425, filed Feb. 8, 2002, entitled "Semiconductor Processing Method Using Photoresist and an Antireflective Coating", naming Terry L. Gilton, Steve W. Bowes, John I. Moore, Joseph F. Brooks and Kristy A. Campbell as inventors, the disclosure of which is incorporated by reference.

TECHNICAL FIELD

This invention relates to semiconductor processing methods which use photoresist and antireflective coatings.

BACKGROUND OF THE INVENTION

Integrated circuitry fabrication typically involves lithographic processing to transfer patterns formed in an imaging layer to an underlying substrate material which will form part of the finished circuitry. One example process is photolithography wherein the imaging layer comprises a photoresist material. The photoresist material is typically formed over a layer to be patterned either by ion implantation, etching or other processing. The photoresist is then masked or otherwise processed such that selected regions of the photoresist are exposed to actinic radiation and thereby patterned. The photoresist is then processed in a manner which removes either the processed or unprocessed portions of the photoresist such that openings extend therethrough to the underlying layer to be patterned.

One process of doing so is by exposure of the photoresist through a mask or reticle to actinic energy to modify the solubility of the exposed region relative to a suitable solvent. The imaging layer is then typically solvent processed to remove one or the other of the processed or non-processed regions, thereby forming the photoresist layer to have mask openings extending entirely therethrough to the underlying layer to be patterned. Typically, the substrate is then subjected to a suitable etching chemistry which is selected to etch the underlying layer or layers and little if any of the photoresist, thereby transferring the imaging pattern to the underlying circuitry layer or layers. Alternately, other processing might be conducted through the patterned openings (i.e., ion implantation) to otherwise form a suitable desired pattern in the underlying layer or layers.

The photoresists utilized are typically entirely transmissive of the actinic energy utilized for their exposure. Unfortunately, some underlying layers are highly reflective of the incident actinic energy, thereby reflecting a substantial quanta back into the photoresist. This can adversely affect resolution and depth of focus, resulting in a less than desired transfer of the mask or reticle pattern into the photoresist.

One known method of reducing such reflection is to provide an antireflective coating over the layer to be patterned prior to the deposition of a photoresist layer thereover. The exposure to actinic energy is thereby intended to be absorbed by the antireflective coating as opposed to reflected back into the photoresist layer. After the exposing to actinic energy, the photoresist is then typically wet processed to form the openings therethrough to the antireflective coating. Thereafter, a different and dry chemistry processing is typically utilized to extend the openings from the photoresist through the antireflective coating to the ultimately desired layer therebeneath to be patterned.

One common antireflective coating material includes an inorganic silicon oxynitride layer. Organic antireflective coatings are also known in the art.

SUMMARY

The invention includes semiconductor processing methods which use photoresist and antireflective coatings. In one implementation, a semiconductor processing method includes forming an antireflective coating comprising Ge and Se over a substrate to be patterned. Photoresist is formed over the antireflective coating. The photoresist is exposed to actinic radiation effective to pattern the photoresist. The antireflective coating reduces reflection of actinic radiation during the exposing than would otherwise occur under identical conditions in the absence of the antireflective coating. After the exposing, the substrate is patterned through openings in the photoresist and the antireflective coating using the photoresist and the antireflective coating as a mask. In one implementation, after patterning the substrate, the photoresist and the antireflective coating are chemically etched substantially completely from the substrate using a single etching chemistry.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
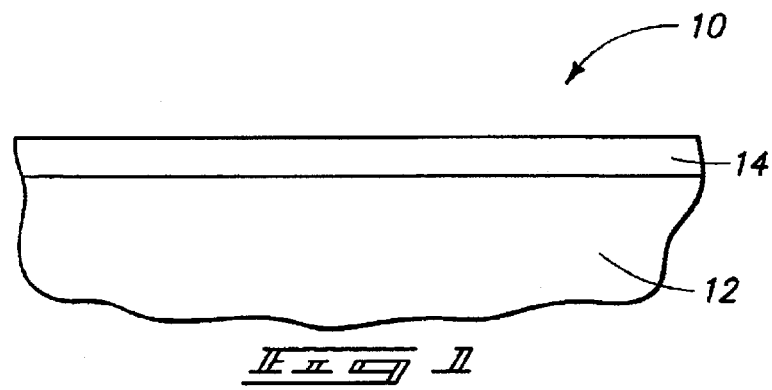
FIG. 1 is a diagrammatic perspective view of a semiconductor wafer fragment/section in process in accordance with an aspect of the invention.

A semiconductor wafer fragment in process, in accordance with the preferred implementation of the invention, is depicted in FIG. 1 with the numeral 10. Such comprises a bulk monocrystalline silicon substrate 12 having a silicon nitride comprising layer 14 formed thereover. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated.

Figure 2:
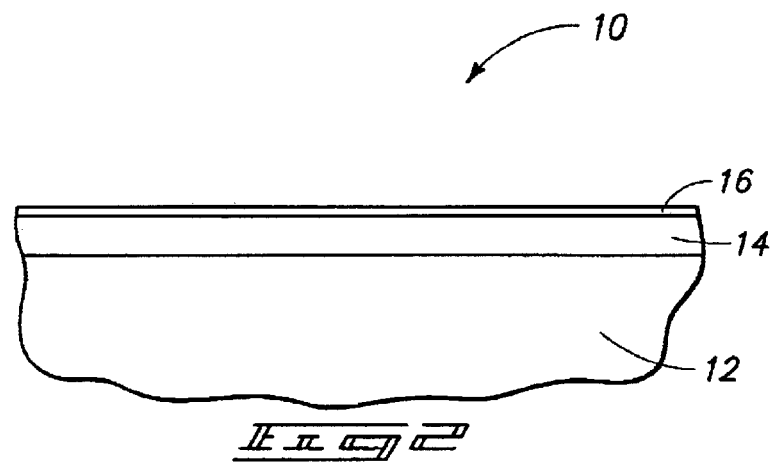
FIG. 2 is a view of the FIG. 1 wafer fragment at a processing step subsequent to that shown by FIG. 1.

Referring to FIG. 2, an antireflective coating 16 has been formed over the substrate 10 of FIG. 1. Antireflective coating 16 comprises both germanium and selenium. Preferably, the antireflective coating contains at least 30 atomic percent germanium and at least 50 atomic percent selenium. More specifically, a more preferred concentration range for the germanium is from 30 atomic percent to 50 atomic percent, more preferably from about 38 atomic percent to about 42 atomic percent, with 40 atomic percent being a specific preferred example. A specific preferred concentration for the selenium is 60 atomic percent. Most preferably, the antireflective coating consists essentially of germanium and selenium. An example process for depositing the germanium and selenium comprising material includes physical vapor deposition, such as for example sputtering using a target comprised of $Ge_xS_y$, with exemplary ranges for "x" and "y" being from 0.38 to 0.42 and from 0.58 to 0.62, respectively. An exemplary preferred thickness range for layer 16 is from 100 Angstroms to 500 Angstroms. Further preferably, antireflective coating 16 is substantially amorphous. In the context of this document, "substantially amorphous" means being at least 90 percent by volume in the amorphous phase. Further preferably, antireflective coating 16 is also homogenous.

Figure 3:
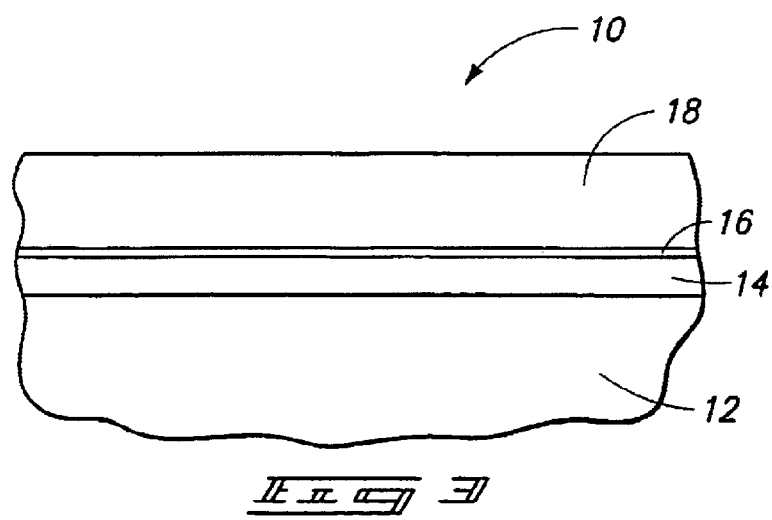
FIG. 3 is a view of the FIG. 2 wafer fragment at a processing step subsequent to that shown by FIG. 2.

Referring to FIG. 3, a layer of photoresist 18 is formed over antireflective coating 16, and preferably on (in contact therewith) antireflective coating 16, as shown. Any suitable photoresist, whether existing or yet-to-be-developed, is contemplated and regardless of whether such comprises a positive or negative type photoresist. By way of example only, exemplary photoresists include stepper operable photoresists, such as MIO84 and SEPR 402.

Figure 4:
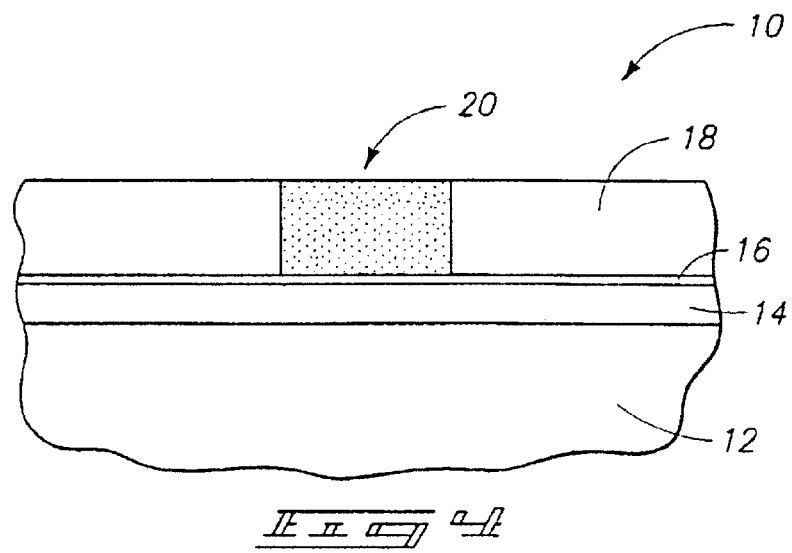
FIG. 4 is a view of the FIG. 3 wafer fragment at a processing step subsequent to that shown by FIG. 3.

Referring to FIG. 4, photoresist 18 has been exposed to actinic radiation (preferably, and by way of example only, using a mask or reticle) to pattern such photoresist. FIG. 4 depicts an exemplary patterned and exposed portion 20 of layer 18, indicated by stippling of such region entirely through layer 18. Antireflective coating 16 reduces reflection of the actinic radiation during the exposing than would otherwise occur under identical conditions in the absence of the antireflective coating, and thereby preferably enhances the patterned transfer to layer 18.

Figure 5:
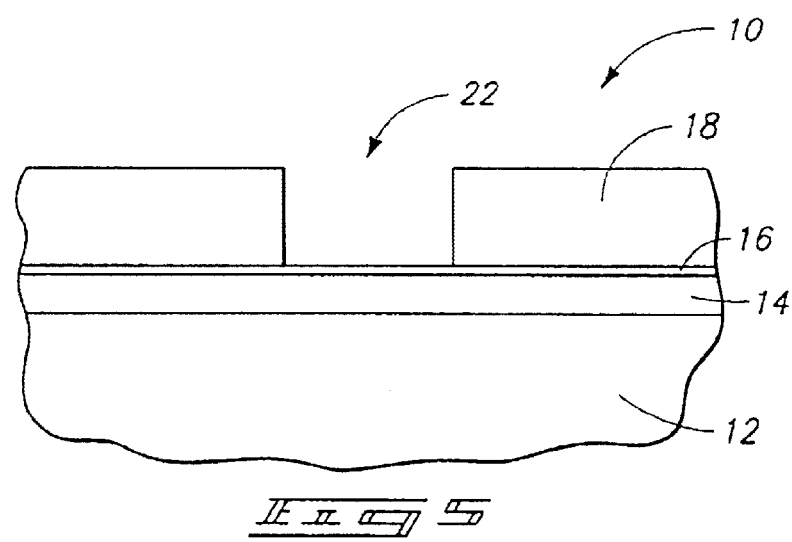
FIG. 5 is a view of the FIG. 4 wafer fragment at a processing step subsequent to that shown by FIG. 4.

Referring to FIG. 5, an opening 22 is formed in photoresist 18 by suitable processing to remove the exemplary exposed portion depicted in FIG. 4. One preferred method is by conventional solvent processing, for example which removes the processed portion relative to the unprocessed portion, effective to form the illustrated opening 22.

Figure 6:
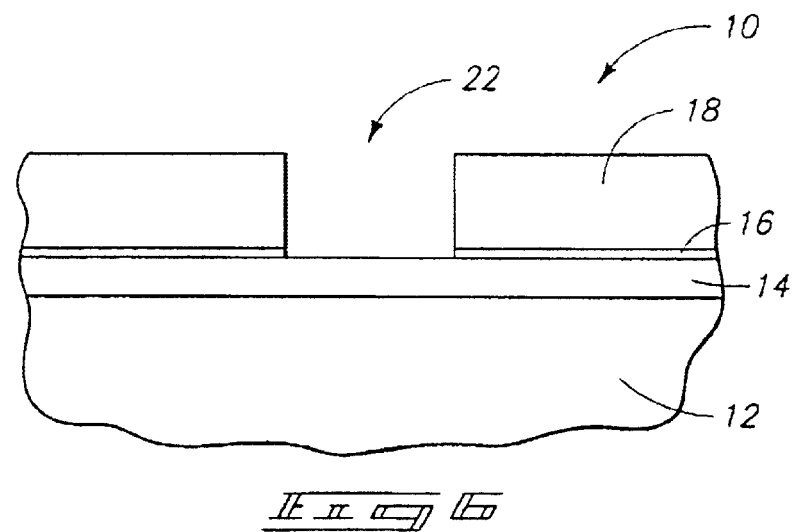
FIG. 6 is a view of the FIG. 5 wafer fragment at a processing step subsequent to that shown by FIG. 5.

Referring to FIG. 6, subsequent etching is conducted of antireflective coating 16 through photoresist openings 22. Such etching is most preferably dry and anisotropic effective to substantially transfer the opening pattern 22 within photoresist layer 18 into antireflective coating material 16. Less preferred would be wet etching of layer 16 through opening 22. One exemplary dry method for removing material 16 includes exposure to oxygen (i.e., $O_2$) at a temperature of less than or equal to about 100° C. in a plasma environment. An exemplary pressure includes at or below 1 Torr and an applied plasma power of 1500 Watts. Such etching might also anisotropically etch some of the photoresist. Another exemplary process is dry etching in an ammonia containing plasma atmosphere.

Exemplary preferred wet etchings include an ammonium hydroxide solution. One exemplary such solution is tetramethyl ammonium hydroxide. Exemplary processing conditions preferably provide the solution at about 25° C. and atmospheric pressure with the concentration of tetramethyl ammonium hydroxide, or other ammonium hydroxide, being from about 1 percent to 50 percent by volume, with at about 2.5 percent being a specific preferred example. Antireflective coating 16 might also be etched by these or another high pH solution, with a preferred pH being from about 9 to about 13.

Figure 7:
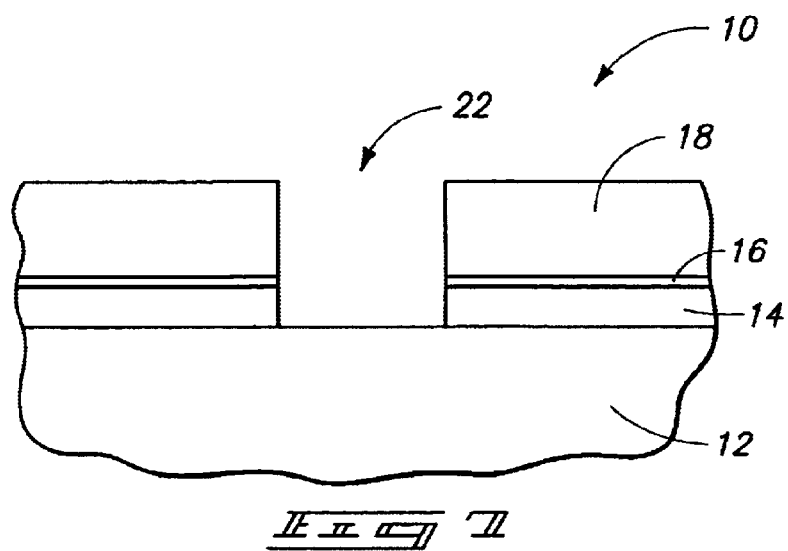
FIG. 7 is a view of the FIG. 6 wafer fragment at a processing step subsequent to that shown by FIG. 6.

Referring to FIG. 7, silicon nitride comprising layer 14 is illustrated as having been subtractively etched through openings 22 in the photoresist and the antireflective coating using the photoresist and the antireflective coating as a mask. By way of example only, exemplary processing conditions for conducting the above-illustrated etch include a pressure of 20 mTorr, power at 800 W, temperature from 200° C. to 600° C., $CHF_3$ flow at 22 sccm, and $CH_2F_2$ flow at 18 sccm for from 10 seconds to 100 seconds.

Such provides but one example of patterning the substrate through openings in the photoresist and the antireflective coating, using the photoresist and the antireflective coating as a mask. Any other possible alternate patterning through the openings, whether existing or yet-to-be-developed, is also of course contemplated. By way of example only, one such alternate exemplary processing would be ion implantation into the layer or layers beneath antireflective coating material 16 as opposed to, or in addition to, subtractive etching thereof.

Figure 8:
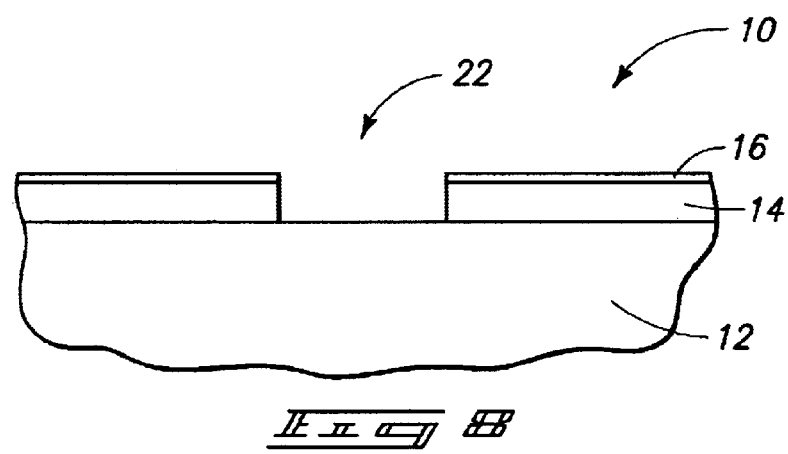
FIG. 8 is a view of the FIG. 7 wafer fragment at a processing step subsequent to that shown by FIG. 7.

Referring to FIG. 8, photoresist layer 18 has been substantially completely removed from the substrate. Exemplary processing for conducting the same includes exposure to an oxygen containing plasma, for example as referred to above. Wet processing to produce the illustrated FIG. 8 construction might also be conducted, for example, by removing the photoresist in a sulfuric acid and hydrogen peroxide solution.

Figure 9:
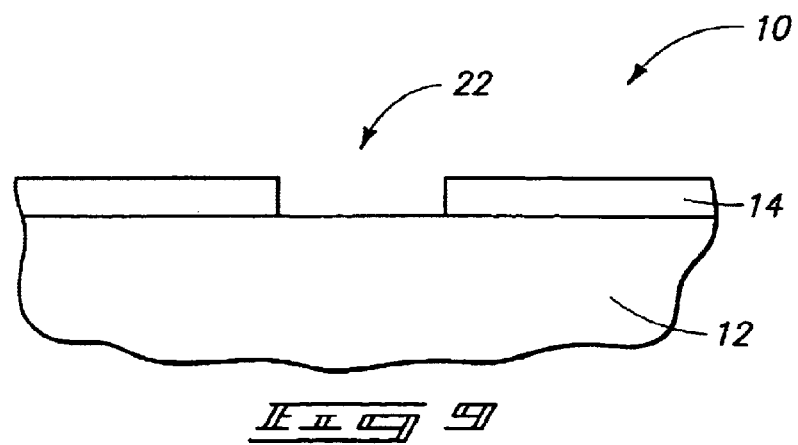
FIG. 9 is a view of the FIG. 8 wafer fragment at a processing step subsequent to that shown by FIG. 8.

FIG. 9 illustrates subsequent removal of antireflective coating 16. Exemplary processes for doing so include any of those described above for removing material 16 to extend contact openings 22 to the underlying substrate layers.

The invention also contemplates chemically etching the photoresist and the antireflective coating substantially completely from the substrate using a single etching chemistry, for example going in a substantial single etching chemistry step from the FIG. 7 to the FIG. 9 construction. For example, such might be conducted utilizing a dry etching chemistry by exposure to an oxygen plasma containing atmosphere, preferably at a temperature above 100° C., effective to completely etch both photoresist 18 and antireflective coating 16 from the substrate, for example preferably in a single/common processing step. Such removal of a germanium and selenium containing antireflective coating might be facilitated by exposing the antireflective coating through the photoresist to radiation having a wavelength from about 190 nanometers to about 450 nanometers, and thereafter dry etching the antireflective coating in an oxygen comprising ambient. Such might be conducted as per the above for extending the photoresist openings through the antireflective coating material 16 to the underlying substrate, or in conjunction with a preferred implementation of completely removing photoresist and the antireflective coating material from the substrate using a single etching chemistry, and preferably in a single/common etching step. Further, the exposing of the antireflective coating through the photoresist to radiation having a wavelength from about 190 nanometers to about 450 nanometers could, of course, be conducted either prior to or after solvent processing of the photoresist to form the initial opening 22 therethrough.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method, comprising:
    forming an antireflective coating comprising Ge and Se over a substrate to be patterned;
    forming photoresist over the antireflective coating, the photoresist being different from the antireflective coating;
    exposing the photoresist to actinic radiation effective to pattern the photoresist to form photoresist patterns over the antireflective coating, the antireflective coating reducing reflection of actinic radiation during the exposing than would otherwise occur under identical conditions in the absence of the antireflective coating;
    after the exposing, patterning the substrate through openings in the photoresist and the antireflective coating using the photoresist patterns and the antireflective coating as a mask; and
    after patterning the substrate, chemically etching the photoresist and the antireflective coating substantially completely from the substrate using a single etching chemistry.

2. The method of claim 1 wherein the single etching chemistry is wet.

3. The method of claim 1 wherein the single etching chemistry is dry.

4. The method of claim 1 wherein the antireflective coating consists essentially of Ge and Se.

5. The method of claim 1 wherein the antireflective coating consists essentially of about 40 atomic percent Ge and about 60 atomic percent Se.

6. The method of claim 1 wherein the antireflective coating is substantially amorphous.

7. The method of claim 1 wherein the antireflective coating comprises at least 30 atomic percent Ge.

8. The method of claim 1 wherein the antireflective coating comprises from 30 atomic percent to 50 atomic percent Ge.

9. The method of claim 1 wherein the antireflective coating comprises from 38 atomic percent to 42 atomic percent Ge.

10. The method of claim 1 wherein the openings in the photoresist and the antireflective coating are formed by solvent processing of the photoresist after the exposing to form the photoresist openings, followed by dry etching of the antireflective coating through the photoresist openings.

11. The method of claim 10 wherein forming the openings in the antireflective coating comprises after said exposing, exposing the antireflective coating through the photoresist to radiation having a wavelength from about 190 nanometers to about 450 nanometers, and thereafter dry etching the antireflective coating in an oxygen comprising ambient.

12. The method of claim 1 wherein the single etching chemistry is dry and comprises exposure to an oxygen plasma containing atmosphere.

13. The method of claim 1 wherein the photoresist contacts the antireflective coating.

14. The method of claim 1 wherein patterning the substrate comprises subtractive etching.

15. The method of claim 1 wherein the chemical etching comprises dry etching comprising exposure to oxygen at a temperature of at least 100° C.

16. The method of claim 1 wherein the antireflective coating has a total thickness which is less than that of the photoresist.

17. A semiconductor processing method, comprising:
    forming an antireflective coating comprising Ge and Se over a substrate to be patterned;
    forming photoresist over the antireflective coating;
    exposing the photoresist to actinic radiation effective to pattern the photoresist, the antireflective coating reducing reflection of actinic radiation during the exposing than would otherwise occur under identical conditions in the absence of the antireflective coating;
    after the exposing, patterning the substrate through openings in the photoresist and the antireflective coating using the photoresist and the antireflective coating as a mask; and
    after patterning the substrate, chemically etching the photoresist and the antireflective coating substantially completely from the substrate using a single etching chemistry, wherein the single etching chemistry is dry and comprises exposure to an oxygen plasma containing atmosphere.

* * * * *